(12) United States Patent
Burkhart et al.

(10) Patent No.: US 11,393,869 B2
(45) Date of Patent: Jul. 19, 2022

(54) WAFER LEVEL SHIM PROCESSING

(71) Applicant: Raytheon Company, Waltham, MA (US)

(72) Inventors: Jeffery H. Burkhart, Orcutt, CA (US); Sean P. Kilcoyne, Lompoc, CA (US); Eric Miller, Lompoc, CA (US)

(73) Assignee: Raytheon Company, Waltham, MA (US)

( * ) Notice: Subject to any disclaimer, the term of this patent is extended or adjusted under 35 U.S.C. 154(b) by 103 days.

(21) Appl. No.: 17/074,736

(22) Filed: Oct. 20, 2020

(65) Prior Publication Data

US 2021/0043665 A1    Feb. 11, 2021

Related U.S. Application Data

(62) Division of application No. 16/285,690, filed on Feb. 26, 2019, now Pat. No. 10,847,569.

(51) Int. Cl.
*H01L 27/146* (2006.01)
*H01L 23/00* (2006.01)

(52) U.S. Cl.
CPC ........ *H01L 27/1469* (2013.01); *H01L 23/562* (2013.01); *H01L 27/14634* (2013.01)

(58) Field of Classification Search
CPC .................................................. H01L 27/1469
See application file for complete search history.

(56) References Cited

U.S. PATENT DOCUMENTS

| | | | |
|---|---|---|---|
| 5,376,580 A | * | 12/1994 | Kish ................... H01L 25/0756 438/455 |
| 5,672,545 A | | 9/1997 | Trautt et al. |
| 5,804,771 A | | 9/1998 | McMahon et al. |
| 6,027,590 A | | 2/2000 | Sylvester et al. |
| 6,093,577 A | | 7/2000 | Van der Groen et al. |
| 7,863,758 B2 | | 1/2011 | Jung et al. |
| 8,084,288 B2 | | 12/2011 | Ginn et al. |
| 8,154,099 B2 | | 4/2012 | Hampp et al. |
| 2002/0134503 A1 | | 9/2002 | Hussinger et al. |
| 2005/0000636 A1 | | 1/2005 | Geiger et al. |

(Continued)

FOREIGN PATENT DOCUMENTS

| | | |
|---|---|---|
| CA | 2 711 266 A1 | 7/2009 |
| CA | 2 709 626 A1 | 12/2011 |

(Continued)

OTHER PUBLICATIONS

European Examination Report dated Nov. 24, 2021 for European Application No. 17723839.1; 8 Pages.

(Continued)

*Primary Examiner* — Douglas M Menz
(74) *Attorney, Agent, or Firm* — Daly, Crowley Mofford & Durkee, LLP

(57) ABSTRACT

An integrated circuit assembly including a first wafer bonded to a second wafer with an oxide layer, wherein a first surface of the first wafer is bonded to a first surface of the second wafer. The assembly can include a bonding oxide on a second surface of the second wafer, wherein a surface of the bonding oxide is polished. The assembly can further include a shim secured to the bonding oxide on the second surface of the second wafer to reduce bow of the circuit assembly.

18 Claims, 6 Drawing Sheets

(56) References Cited

U.S. PATENT DOCUMENTS

| | | | |
|---|---|---|---|
| 2007/0104960 A1 | 5/2007 | Asano et al. | |
| 2007/0155129 A1 | 7/2007 | Thallner | |
| 2008/0217717 A1 | 9/2008 | Pfister et al. | |
| 2010/0001188 A1 | 1/2010 | Ginn et al. | |
| 2011/0042772 A1 | 2/2011 | Hampp et al. | |
| 2011/0308739 A1 | 12/2011 | McCutcheon et al. | |
| 2012/0024456 A1* | 2/2012 | Lin | H01L 21/67092 156/64 |
| 2012/0263946 A1 | 10/2012 | Mitsukura et al. | |
| 2013/0026592 A1* | 1/2013 | Lapadatu | H01L 27/1467 438/69 |
| 2013/0084459 A1 | 4/2013 | Larson et al. | |
| 2013/0316516 A1 | 11/2013 | Deguchi | |
| 2014/0011316 A1 | 1/2014 | Park et al. | |
| 2015/0110990 A1 | 4/2015 | Chou et al. | |
| 2015/0118784 A1 | 4/2015 | Gerber et al. | |
| 2017/0351041 A1* | 12/2017 | Math | G02B 6/4206 |
| 2018/0068843 A1 | 3/2018 | Cahill et al. | |
| 2018/0096833 A1 | 4/2018 | Cahill et al. | |
| 2018/0190705 A1 | 7/2018 | Kilcoyne et al. | |
| 2019/0287854 A1* | 9/2019 | Miller | H01L 22/20 |
| 2020/0273893 A1 | 8/2020 | Burkhart et al. | |

FOREIGN PATENT DOCUMENTS

| | | |
|---|---|---|
| JP | H03-41715 | 2/1991 |
| JP | H 08-39377 A | 2/1996 |
| JP | 2012-004522 A | 1/2012 |
| JP | 2009-237202 | 10/2015 |
| KR | 10-2006-0035718 A | 4/2006 |
| KR | 10-2012-0099530 A | 9/2012 |
| KR | 10-1239282 B1 | 3/2013 |
| WO | WO 94/17557 | 8/1994 |
| WO | WO 2005/008734 A2 | 1/2005 |
| WO | WO 2005/079199 A2 | 9/2005 |
| WO | WO 2009/094558 A3 | 7/2009 |
| WO | WO 2012/118700 A1 | 9/2012 |
| WO | WO 2014/157082 | 10/2014 |
| WO | WO 2014/191033 A1 | 12/2014 |
| WO | WO 2015/009801 A1 | 1/2015 |
| WO | WO 2015/190479 | 12/2015 |

OTHER PUBLICATIONS

PCT International Preliminary Report dated Sep. 10, 2021 for International Application No. PCT/US2019/061041; 8 Pages.

Response (with English Translation) to Japanese Office Action dated Apr. 13, 2021 for Japanese Application No. 2020-511890; Response filed Jun. 24, 2021; 11 Pages.

U.S. Appl. No. 15/827,220, filed Nov. 30, 2017, Cahill et al.

Encyclopedia Britannica, "Cryogenics;" Retrieved Aug. 31, 2017 from https://www.britannica.com/science/cryogenics; 1 Page.

Kim et al., "Low Temperature Epoxy Bonding for Wafer Level MEMS Packaging;" Sensors and Actuators A: Physical, vol. 143, Issue 2; May 16, 2008; pp. 323-328; 6 Pages.

PCT International Search Report and Written Opinion dated Sep. 27, 2017 for International Application No. PCT/US2017/030796; 16 Pages.

PCT International Preliminary Report dated Mar. 21, 2019 for International Application No. PCT/US2017/030796; 8 Pages.

European 161/162 Communication dated May 10, 2019 for European Application No. 17723839.1; 3 Pages.

Response (with Amended Claims) to European 161/162 Communication dated May 10, 2019 for European Application No. 17723839.1; Response filed Nov. 11, 2019; 10 Pages.

Korean Office Action (with English Translation) dated Jan. 22, 2020 for Korean Application No. 10-2018-7033253; 14 Pages.

Response (with Machine English Translation) to Korean Office Action dated Jan. 22, 2020 for Korean Application No. 10-2018-7033253; Response filed Mar. 5, 2020; 25 Pages.

Korean Office Action (with English Translation & Current Pending Claims) dated Jun. 25, 2020 for Korean Application No. 10-2018-7033253; 7 Pages.

Response (with Machine English Translation) to Korean Office Action dated Jun. 25, 2020 for Korean Application No. 10-2018-7033253; Response filed Aug. 5, 2020; 11 Pages.

Japanese Notice of Reasons for Refusal (with Machine English Translation) dated Feb. 4, 2020 for Japanese Application No. 2019-503708; 8 Pages.

Response (with Machine English Translation) to Japanese Office Action dated Feb. 4, 2020 for Japanese Application No. 2019-503708; Response filed Apr. 30, 2020; 15 Pages.

Japanese Intention to Grant (with Machine English Translation from Espacenet.com) dated Sep. 15, 2020 for Japanese Application No. 2019-503708; 8 Pages.

U.S. Restriction Requirement dated Feb. 2, 2017 for U.S. Appl. No. 15/258,300; 6 Pages.

Response to U.S. Restriction Requirement dated Feb. 2, 2017 for U.S. Appl. No. 15/258,300; Response Filed Feb. 15, 2017; 1 Page.

U.S. Non-Final Office Action dated Mar. 17, 2017 for U.S. Appl. No. 15/258,300; 9 Pages.

Response to U.S. Non-Final Office Action dated Mar. 17, 2017 for U.S. Appl. No. 15/258,300; Response Filed Jun. 15, 2017; 7 Pages.

U.S. Final Office Action dated Aug. 24, 2017 for U.S. Appl. No. 15/258,300; 15 Pages.

U.S. Non-Final Office Action dated May 15, 2018 for U.S. Appl. No. 15/820,839; 25 Pages.

Response to U.S. Non-Final Office Action dated May 15, 2018 for U.S. Appl. No. 15/820,839; Response filed on Sep. 11, 2018; 11 Pages.

U.S. Final Office Action dated Jan. 10, 2019 for U.S. Appl. No. 15/820,839; 24 Pages.

Response to U.S. Final Office Action dated Jan. 10, 2019 for U.S. Appl. No. 15/820,839; Response filed Mar. 21, 2019; 11 Pages.

Notice of Allowance dated Jul. 16, 2019 for U.S. Appl. No. 15/820,839; 13 Pages.

PCT International Search Report and Written Opinion dated Jul. 5, 2018 for PCT Application No. PCT/US2018/021967; 15 Pages.

PCT International Preliminary Report dated Mar. 12, 2020 for International Application No. PCT/US2018/021967; 9 Pages.

Korean Voluntary Amendment (with Machine English Translation) dated Mar. 9, 2020 for Korean Application No. 10-2020-7006895; 6 Pages.

Korean Office Action (with Machine English Translation) dated Apr. 18, 2020 for Korean Application No. 10-2020-7006895; 7 Pages.

Response (with Machine English Translation) to Korean Office Action dated Apr. 18, 2020 for Korean Application No. 10-2020-7006895; Response filed Jun. 16, 2020; 23 Pages.

Korean Notice of Allowance (with Machine English Translation and Allowed Claims) dated Jul. 30, 2020 for Korean Application No. 10-2020-7006895; 5 Pages.

European 161/162 Communication dated April 7, 2020 for European Application No. 18716025.4; 3 Pages.

Response (with Amended Claims) to European 161/162 Communication dated Apr. 7, 2020 for European Application No. 18716025.4; Response filed Sep. 24, 2020; 12 Pages.

Israeli Notice of Allowance (with Reporting E-Mail from FA and Allowed Claims in English) dated Jul. 9, 2020 for Israeli Application No. 271713; 8 Pages.

U.S. Non-Final Office Action dated Oct. 3, 2018 for U.S. Appl. No. 15/827,220; 7 Pages.

Response to U.S. Non-Final Office Action dated Oct. 3, 2018 for U.S. Appl. No. 15/827,220; Response filed Dec. 21, 2018; 10 Pages.

U.S. Notice of Allowance dated Feb. 8, 2019 for U.S. Appl. No. 15/827,220; 10 Pages.

PCT International Search Report and Written Opinion dated Mar. 30, 2020 for International Application No. PCT/US2019/061041; 13 Pages.

U.S. Restriction Requirement dated Jun. 26, 2020 for U.S. Appl. No. 16/285,690; 7 Pages.

Response to U.S. Restriction Requirement dated Jun. 26, 2020 for U.S. Appl. No. 16/285,690; Response filed Jul. 27, 2020; 1 Page.

(56) References Cited

OTHER PUBLICATIONS

U.S. Notice of Allowance dated Aug. 21, 2020 for U.S. Appl. No. 16/285,690; 11 Pages.
Japanese Notice of Allowance (with Machine English Translation and Allowed Claims) dated Sep. 30, 2021 for Japanese Application No. 2020-511890; 7 Pages.
Israeli Notice of Allowance (with Foreign Associate Reporting E-Mail and English Translated Allowed Claims) dated Sep. 5, 2021 for Israeli Application No. 283688; 8 Pages.
Korean Grant of Patent (with Machine English Translation from Espacenet.com and Allowed Claims in English) dated Dec. 15, 2020 for Korean Application No. 10-2018-7033253; 7 Pages.
Japanese Office Action (with Machine translation from Espacenet.com) dated Apr. 8, 2021 for Japanese Application No. JP2020-511890; 14 Pages.
Response to European Examination Report dated Nov. 24, 2021 for European Application No. 17723839.1; Response filed Apr. 4, 2022; 24 Pages.

* cited by examiner

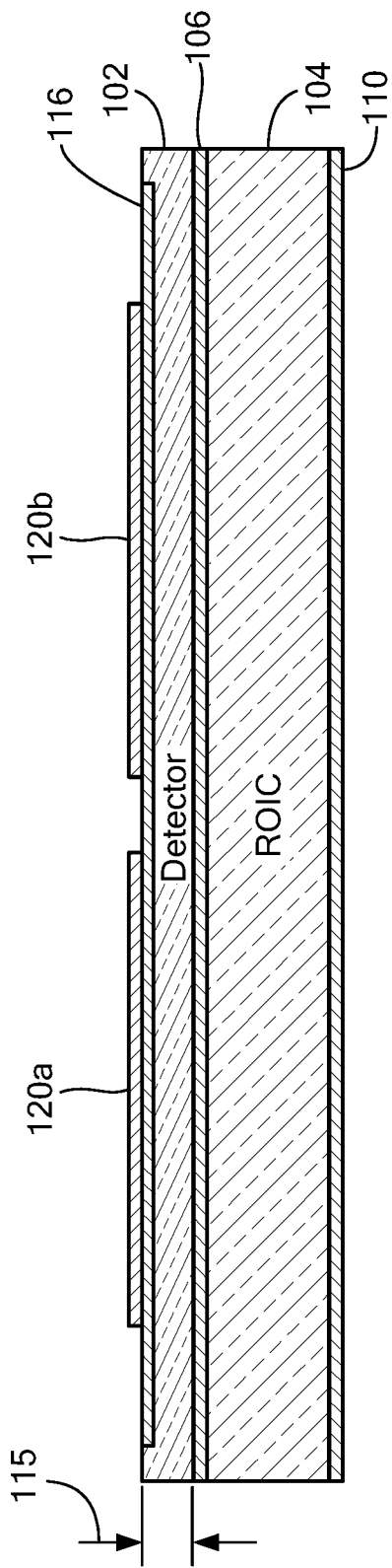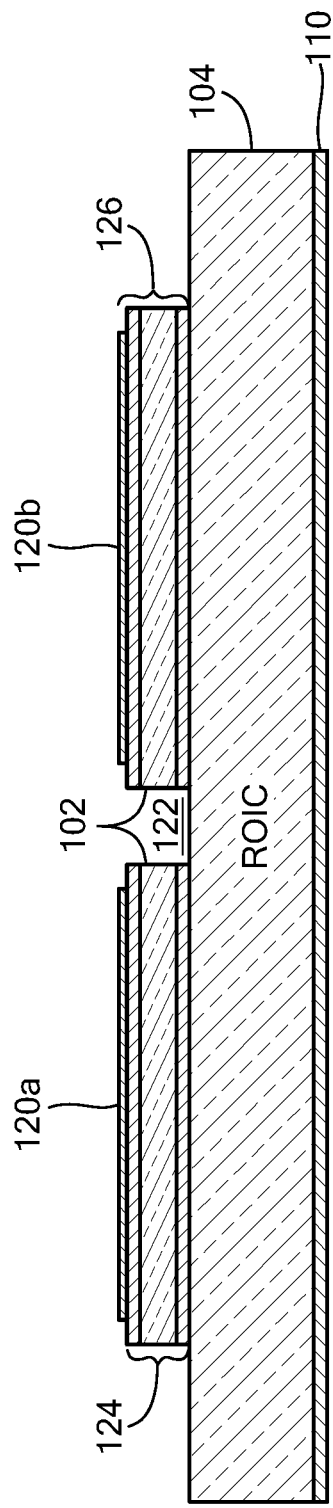

WAFER LEVEL SHIM PROCESSING

CROSS-REFERENCE TO RELATED APPLICATIONS

This application is a Divisional application of U.S. patent application Ser. No. 16/285,690 filed Feb. 26, 2019, which application is hereby incorporated herein by reference in its entirety.

BACKGROUND

Wafer processing can include shims to promote flatness. Conventional die processing can include epoxy application for a die level shim which can leave voids in the bond interface layer. A shim provides a mechanical layer to impart a Z-axis shift and/or add thermal dissipation.

For some devices it is highly desirable to have a flat die. For example, sensing devices, such as focal plane arrays, can include die that can have sensors and/or circuitry. Conventional techniques for attempting to achieve flat die, e.g., to remove bow in the die, may include the use of glass beads in an epoxy bondline to control thickness. Weights can be used to flatten the device after epoxy application. However, some known techniques to remove bow in a die may put an assembly, such as focal planes, at risk, such as due to weight contact with optical surface.

SUMMARY

Embodiments of the invention provide methods and apparatus for processing a wafer using oxide deposited for bonding a shim at the wafer level at room temperature at atmosphere, for example. Embodiments can include bow compensation to reduce bow in the die. Integrating bonding oxide deposition into a sensor chip assembly (SCA) process flow reduces the likelihood of damaging a delicate front side of the imager, for example. In embodiments, an oxide layer for shim attachment is applied before thinning to prevent damage to the wafer surface. It will be appreciated that a wafer providing a photodetector should have a polished and defect-free surface to enhance detector performance.

Embodiments can include ion implantation and annealing to bond multiple wafers using oxide-to-oxide bonding for production of silicon-based imaging arrays. In example embodiments, a first wafer is provided as a detector wafer bonded to a second wafer provided as a ROIC (read out integrated circuit) wafer. In embodiments, DBH bonding can be used to attach the first and second wafers. In embodiments, DBH bonding refers to using direct bond hybridization to form a covalent bonding between wafers.

After the first and second wafers are bonded, oxide can be deposited to the backside of the ROIC wafer prior to detector thinning, for example. Oxide can be deposited to the backside of the ROIC wafer after which a shim can be bonded to the SCA. In embodiments, the shim is bonded to the assembly using low temperature, e.g., room temperature, lower than the DBH temperatures used to bond the first and second wafers.

The illustrative steps enable assembly of a CTE (coefficient of thermal expansion) engineered structure for focal plane array (FPA) detectors, for example. In addition, wafer bow can be modified to promote die flatness in the final assembly. Also, the bonded wafers increase rigidity to allow post bond processing of thin outside wafers. Further, thin film deposition for oxide, for example, can improve SCA/die Z-height control/flatness over adhesives. In embodiments, bonding oxide is deposited by PECVD or PVD have high uniformity (5000±500 Å), whereas epoxy has a large variation (e.g., 10000-20000±50000 Å) across a 200 mm wafer.

It will be appreciated that increasing a flatness of an optical surface is desirable to increase performance, resolution, and the like, of a sensing device, such as a device in a FPA. By decreasing bow in the die, the optical plane of the sensor is flattened for enhanced sensor performance.

With use of the above illustrative processing, an example process allows for standard wafer thicknesses to enable standard wafer processing equipment (e.g., no handling 1500-3000 mm thick wafers).

In one aspect, a method comprises: deploying a circuit assembly having a first wafer bonded to a second wafer with an oxide layer, wherein a first surface of the first wafer is bonded to a first surface of the second wafer; creating a bonding oxide on a second surface of the second wafer; thinning the first wafer after depositing the bonding oxide; annealing the circuit assembly; applying a coating over at least a portion of the first wafer after annealing the circuit assembly; polishing the bonding oxide on the second surface of the second wafer; securing a shim to the bonding oxide on the second surface of the second wafer to reduce bow of the circuit assembly; and removing the coating.

A method can further include one or more of the following features: the circuit assembly comprises a sensor circuit assembly with interconnection embedded in the bond interface, the first wafer comprises a detector, the second wafer comprises a read out integrated circuit (ROIC), the circuit assembly provides a sensor for a focal plane array, the circuit assembly does not comprise epoxy, applying photoresist material to the first wafer prior to bonding the shim, applying a non-photosensitive material to the first wafer prior to bonding the shim, removing the photoresist material prior to annealing the circuit assembly, removing the non-photosensitive material prior to annealing the circuit assembly, the bonding oxide bonding oxide has a uniformity of about 5000±500 Å, and/or the shim comprises a material selected from the group consisting of Silicon, AlN, and sapphire.

In another aspect, an integrated circuit assembly comprises: a circuit assembly having a first wafer bonded to a second wafer with an oxide layer, wherein a first surface of the first wafer is bonded to a first surface of the second wafer; a bonding oxide on a second surface of the second wafer, wherein a surface of the bonding oxide is polished; and a shim secured to the bonding oxide on the second surface of the second wafer to reduce bow of the circuit assembly.

An assembly can further include one or more of the following features: the circuit assembly comprises a sensor circuit assembly with interconnection embedded in the bond interface, the first wafer comprises a detector, the second wafer comprises a read out integrated circuit (ROIC), and/or the circuit assembly does not comprise epoxy.

BRIEF DESCRIPTION OF THE DRAWINGS

The foregoing features of this invention, as well as the invention itself, may be more fully understood from the following description of the drawings in which:

FIG. 6 is a schematic representation of an example assembly after applying a coating to a surface of the assembly in at least one region;

FIG. 7 is a schematic representation of an example assembly after etching the assembly;

DETAILED DESCRIPTION

Figure 1:
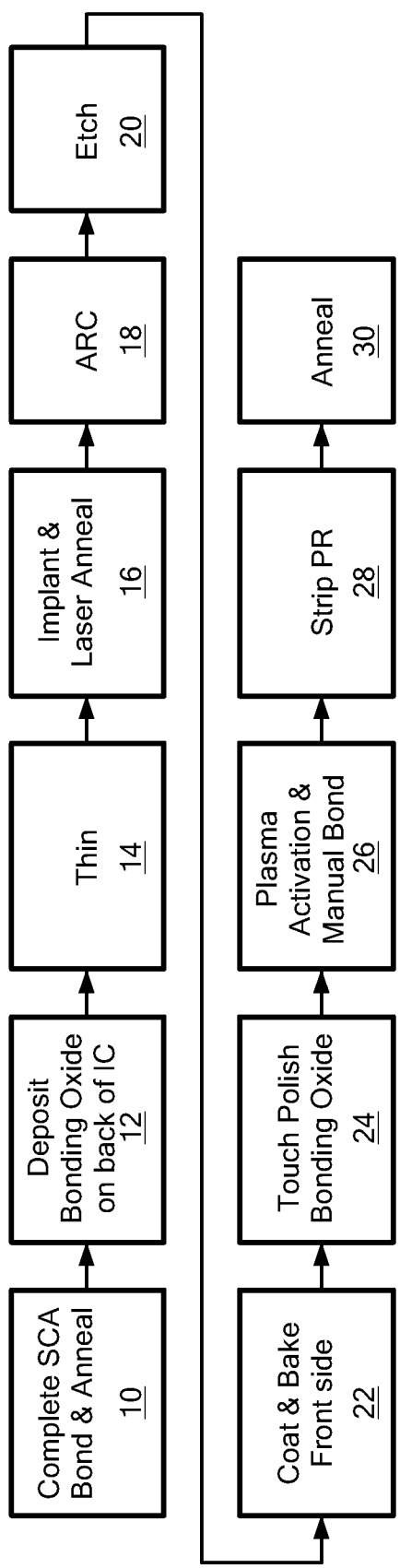
FIG. 1 is a flow diagram showing an example sequence of steps for providing an assembly having an oxide bonded shim to reduce wafer bow.

FIG. 1 shows example process steps for providing an assembly having a shim in which bonding oxide deposition is integrated into the process for minimizing damage to a front side of the assembly, such as an imager forming part of a focal plane array (FPA). The assembly can include an oxide-bonded shim to reduce bow in the sensor and flatten an optical plane for enhanced sensor performance.

Figure 2:
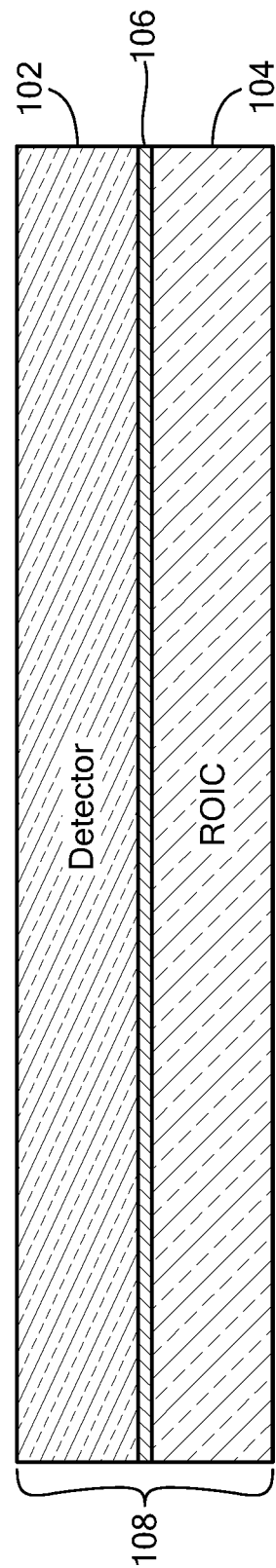
FIG. 2 is a schematic representation of an example assembly after bonding first and second layers with an oxide layer.

In step 10 of FIG. 1 and referring to FIG. 2, a first wafer 102 is bonded to a second wafer 104 with a bonding oxide layer 106 to form an assembly 108, which can be provided as a sensor chip assembly (SCA). In embodiments, DBH bonding can be used to attach the first and second wafers 102, 104 with integrated interconnection layer for electrical connections using embedded metal posts and high temperature annealing in a manner well known in the art.

In embodiments, the first wafer 102 corresponds to a detector and the second wafer 104 corresponds to a read out integrated circuit (ROIC). As is known in the art, a ROIC refers to an integrated circuit configured to read data from certain types of detectors, such as infrared sensors. In general, the ROIC accumulates photocurrent from pixels for transferring the respective pixel signals onto output taps for readout. The pixels can form a focal plane array to detect a variety of signals.

It is understood that the first and second wafers can be provided with any suitable functionality and features to meet the needs of a particular embodiment. It is understood that a SCA having a first wafer provided as a detector and a second wafer provided as a ROIC is one particular embodiment that should not be construed as limiting with respect to the functionality of the wafers in an assembly. The assembly can have varying thicknesses depending upon the application. An illustrative thickness is about 725 µm.

Figure 3:
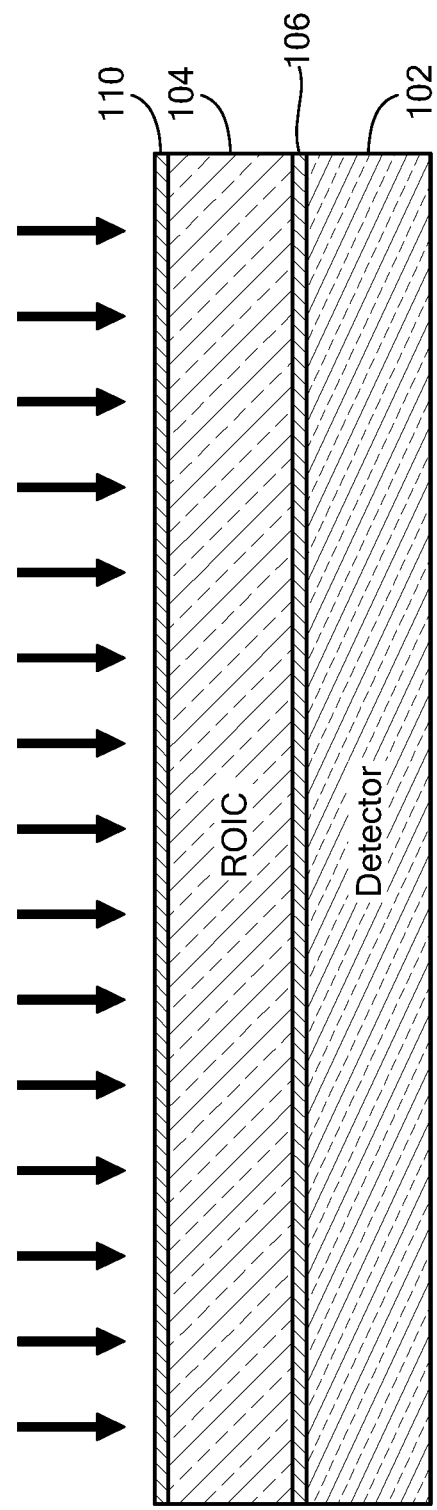
FIG. 3 is a schematic representation of an example assembly after depositing a bonding oxide to a surface of the assembly.

In step 12, and referring to FIG. 3, a bonding oxide 110 for later attachment of a shim is deposited onto the second wafer 104 of the assembly 108. In embodiments, the assembly 108 is flipped prior to application of the bonding oxide 110 using ion implantation and annealing. The bonding oxide 110 has a thickness selected to achieve certain tuning of wafer bow/flatness characteristics. It will be appreciated that in many applications, such as FPAs, it is desirable to minimize bow of the detectors and/or complete hybrid focal plane structure.

Figure 4:
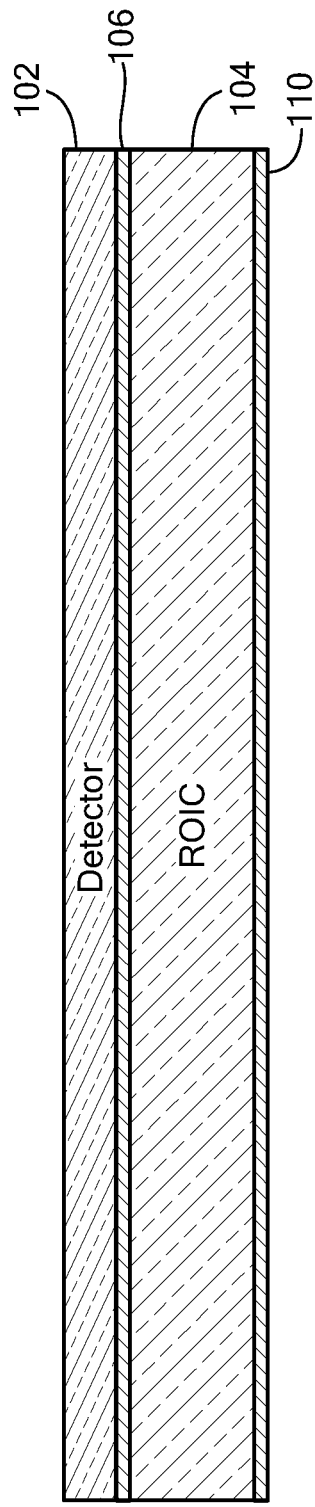
FIG. 4 is a schematic representation of an example assembly after thinning the first layer.

In step 14, referring to FIG. 4, the first wafer 102 is processed so that a thickness 115 of the first wafer 102 is reduced to a desired level, such as about 40 µm. For an illustrative visible hybrid CMOS imager the range is about 5-185 µm, depending on the required spectral response in the near infrared spectrum.

In embodiments, the bonding oxide layer 110 to later attach a shim is applied prior thinning the first wafer 102. With this arrangement, the likelihood of damage to the first wafer 102 (i.e., the detector) is reduced as compared with conventional processing techniques in which an attachment mechanism is applied to second wafer 104 (i.e., the ROIC) after wafer thinning (backgrind and CMP) so that the assembly 108 must be flipped and possibly damaged. In the conventional process, the bonding oxide is applied after the SCA completion. This requires the fragile imaging surface of the top device to be place face down in onto chucks and handled with vacuum tooling which can scratch the surface, causing optical defects or circuit damage.

Figure 5:
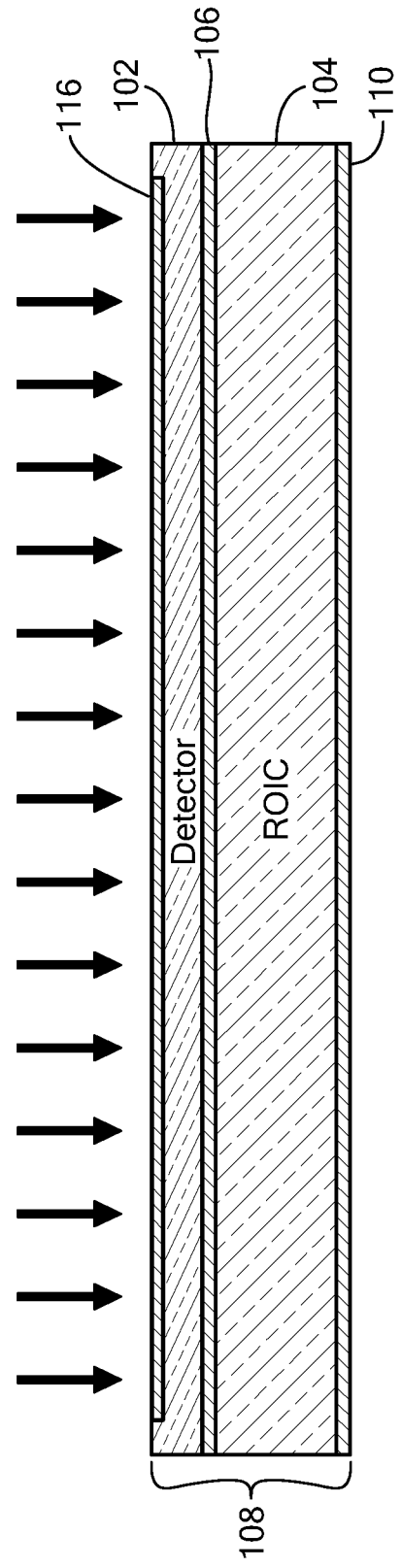
FIG. 5 is a schematic representation of an example assembly after annealing.

In step 16, referring to FIG. 5, the assembly 108 is subject to implant and laser anneal to form layer 116 for the first wafer 102. This process is used to apply a conductive layer to the backside surface after hybrid processing has completed, where thermal anneal temperatures (>900° C.) cannot be tolerated.

In optional step 18, referring to FIG. 6, a coating 120, such as an optical anti-reflective coating (ARC) is applied to the assembly. In embodiments, the coating 120 has a first portion 120a covering a first region of the detector layer of the first wafer 102 and a second portion 120b covering a second region of the detector layer. Any damage to the multi-layer ARC films will result in reduced optical performance of the sensor.

In step 20, referring to FIG. 7, the assembly 108 is etched to singulate the detector wafer into individual die 122 of the second wafer 104 to form multiple detectors 124, 126 on respective die.

Figure 8:
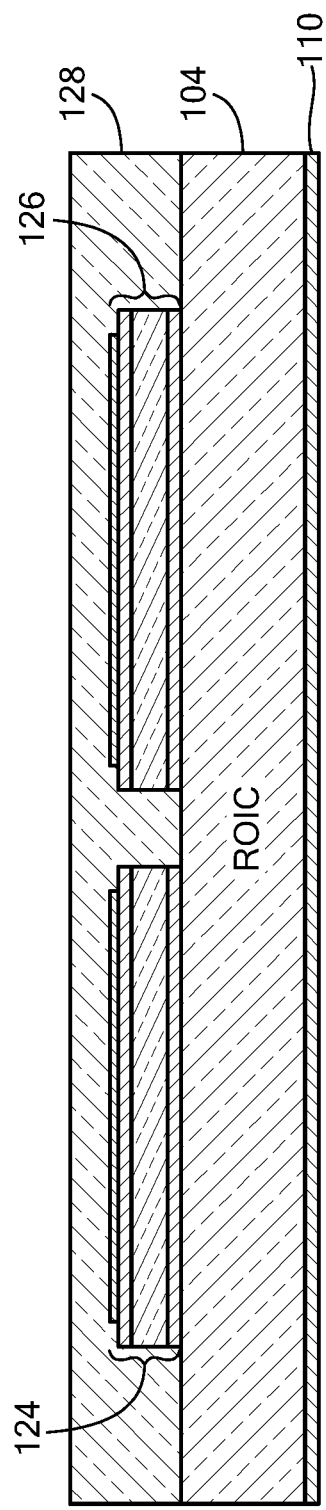
FIG. 8 is a schematic representation of an example assembly after applying a photoresist material.

In step 22, referring to FIG. 8, a photoresist coating 128 is applied to the assembly 108 to protect the detectors 124, 126. The coated assembly 108 can be baked to cure the photoresist material, as needed.

Figure 9:
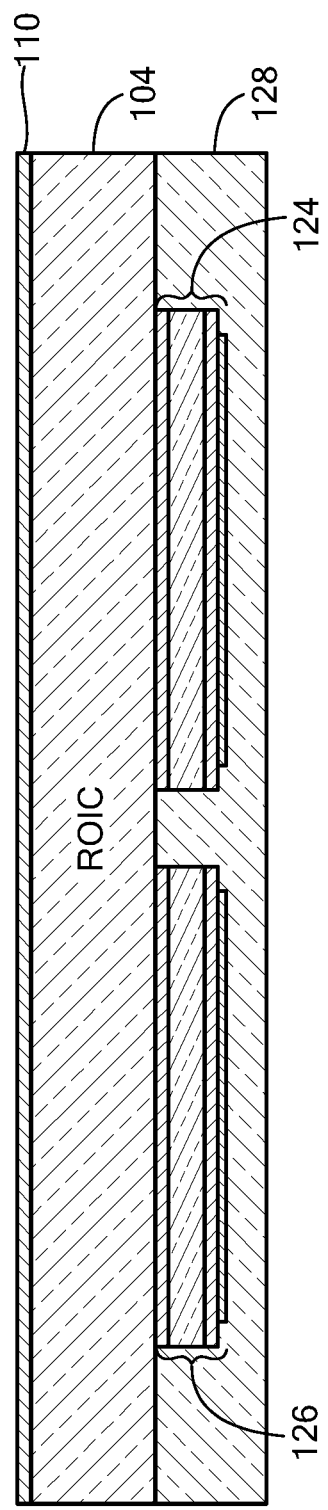
FIG. 9 is a schematic representation of an example assembly after polishing the bonding oxide on the surface of the assembly.

In step 24, referring to FIG. 9, the bonding oxide layer 110 that was applied to second wafer 104 for bonding a shim is polished, such as by CMP (chemical mechanical planarization) polishing to produce a surface roughness acceptable for fusion bonding. In embodiments, the assembly 108 is flipped for polishing.

Figure 10:
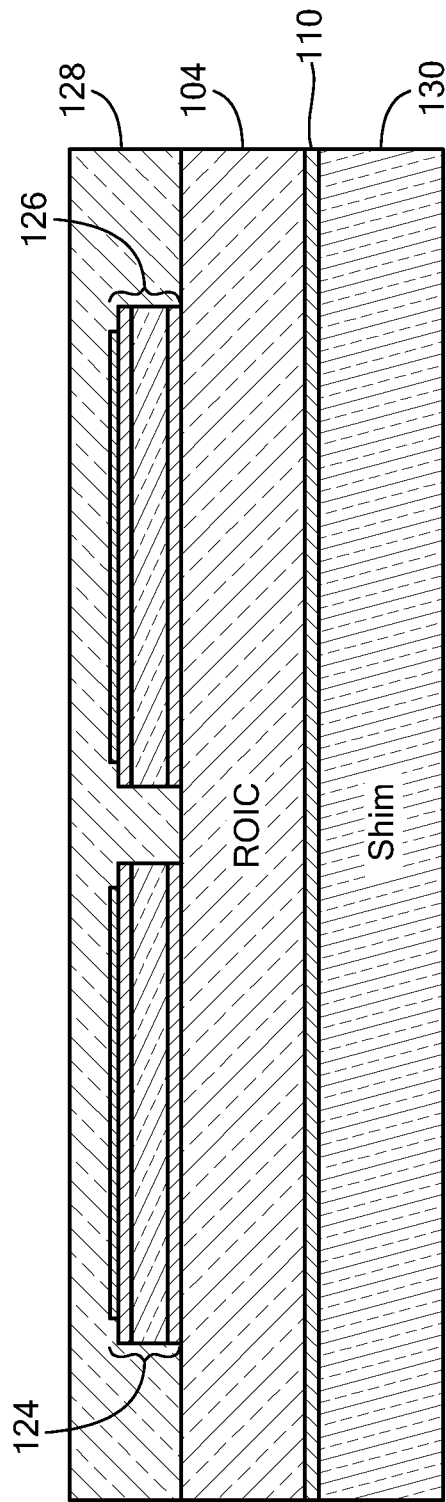
FIG. 10 is a schematic representation of an example assembly after bonding a shim to the assembly using the oxide layer.

In step 26, referring to FIG. 10, a shim 130 is applied to the oxide layer 110 on the surface of the second wafer 104. In embodiments, the shim 130 can be bonded at or about room temperature. In one embodiment, the shim 130 is manually applied to the assembly 108. In other embodiments, suitable machines are used to attach the shim 130. It will be appreciated that the annealing temperature for oxide activation of layer 110 should be less that the annealing temperature used during annealing to DBH bond the first and second wafers 102 and 104 of the assembly 108 in step 10. For example, the interconnection DBH bond can occur at 300° C., whereas the shim bond can occur at 200° C., so the shim bond will not affect the interconnection.

In embodiments, the shim 130 can comprise silicon with a thickness and rigidity to achieve a desired reduction in wafer bow. Examples of shim materials include Silicon (100-3000 μm), AlN (500-3000 μm), and sapphire (500-3000 μm).

Figure 11:
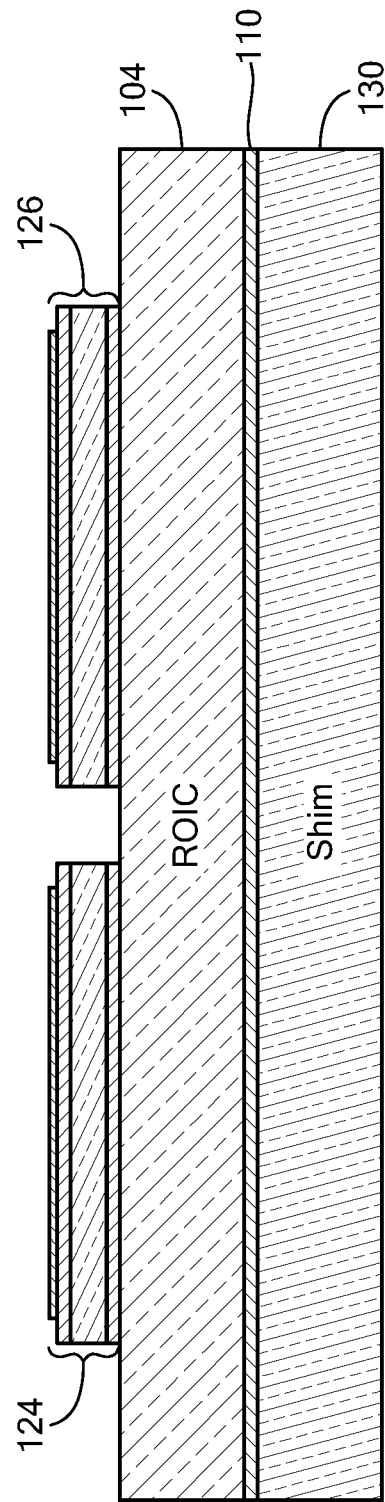
FIG. 11 is a schematic representation of an example assembly after removing the photoresist material.

In step 28, referring to FIG. 11, the photoresist material 128 can be removed from the assembly 108 which can then be annealed in step 30. In embodiments, annealing of the assembly 108 is performed at a temperature in the order of 150 degrees. The anneal converts the weak van der Waal bond to a very strong covalent bond to increase the wafer bond strength, rendering the bond permanent.

In embodiments, by using the shim, pre-existing bow in the die is significantly reduced or eliminated resulting in an ultra-flat optical surface. In addition, the use of bonding oxide for securing the shim to the assembly generates minimal, if any, voids, which may be an issue in epoxy-based shim processing. Application epoxy is generally challenging to deliver thin, uniform layers without voided regions due to the thick viscosity and deposition methods. Any voids in the layer will become a bond void after wafer bonding, leading to poor thermal and mechanical properties.

It is understood that embodiments of the invention are applicable to a wide range of devices having die for which flatness is desirable, such as SCAs and FPAs. A sensor chip assembly (SCA) or focal plane array (FPA) refers to an image sensing device having an array of light-sensing pixels at the focal plane of a lens. FPAs may be useful for imaging applications, such as taking pictures or videos, as well as non-imaging applications. Example applications include spectrometry, LIDAR, guidance systems, inspection, wavefront sensing, infrared astronomy, manufacturing inspection, thermal imaging for firefighting, medical imaging, and infrared phenomenology. Some FPAs operate by detecting photons at particular wavelengths and generating an electrical charge, voltage, or resistance in relation to the number of photons detected at each pixel. This charge, voltage, or resistance is then measured, digitized, and used to construct an image of the object, scene, or phenomenon that emitted the photons.

In illustrative embodiments, a die can have an example bow of +/−50 microns prior to processing and an example bow of about 2 microns after processing with an example range of about ±5 μms. In an illustrative embodiment, a die having a pre-processing bow of about 50 microns and a post-processing bow of about 2 microns provides a 96% reduction in bow. An example shim will have a bow of less than about 2 microns.

Having described exemplary embodiments of the invention, it will now become apparent to one of ordinary skill in the art that other embodiments incorporating their concepts may also be used. The embodiments contained herein should not be limited to disclosed embodiments but rather should be limited only by the spirit and scope of the appended claims. All publications and references cited herein are expressly incorporated herein by reference in their entirety.

Elements of different embodiments described herein may be combined to form other embodiments not specifically set forth above. Various elements, which are described in the context of a single embodiment, may also be provided separately or in any suitable subcombination. Other embodiments not specifically described herein are also within the scope of the following claims.

What is claimed is:

1. An integrated circuit assembly, comprising:
a circuit assembly having a first wafer bonded to a second wafer with an oxide layer, wherein a first surface of the first wafer is bonded to a first surface of the second wafer;
a bonding oxide on a second surface of the second wafer, wherein a surface of the bonding oxide is polished; and
a shim secured to the bonding oxide on the second surface of the second wafer to reduce bow of the circuit assembly.

2. The assembly according to claim 1, wherein the circuit assembly comprises a sensor circuit assembly with interconnection embedded in the bond interface.

3. The assembly according to claim 1, wherein the first wafer comprises a detector.

4. The assembly according to claim 2, wherein the second wafer comprises a read out integrated circuit (ROIC).

5. The assembly according to claim 1, wherein the circuit assembly does not comprise epoxy.

6. The assembly according to claim 1, wherein the first wafer is thinned.

7. The assembly according to claim 6, wherein the assembly is annealed.

8. The assembly according to claim 7, wherein at least a portion of the first wafer is coated.

9. The assembly according to claim 8, wherein the bonding oxide on the second surface of the second wafer is polished.

10. An integrated circuit assembly, comprising:
a circuit assembly having a first wafer bonded to a second wafer with an oxide layer, wherein a first surface of the first wafer is bonded to a first surface of the second wafer;
a bonding means for bonding a second surface of the second wafer; and
a shim means for reducing bow of the circuit assembly secured to the bonding oxide on the second surface of the second wafer.

11. The assembly according to claim 10, wherein the circuit assembly comprises a sensor circuit assembly with interconnection embedded in a bond interface.

12. The assembly according to claim 10, wherein the first wafer comprises a detector.

13. The assembly according to claim 12, wherein the second wafer comprises a read out integrated circuit (ROIC).

14. The assembly according to claim 10, wherein the circuit assembly does not comprise epoxy.

15. The assembly according to claim 10, wherein the first wafer is thinned.

16. The assembly according to claim 15, wherein the assembly is annealed.

17. The assembly according to claim 16, wherein at least a portion of the first wafer is coated.

18. The assembly according to claim 17, wherein the bonding oxide on the second surface of the second wafer is polished.

* * * * *